(12) United States Patent
Csutak et al.

(10) Patent No.: US 6,759,675 B2
(45) Date of Patent: Jul. 6, 2004

(54) OPTICAL DEVICE AND METHOD THEREFOR

(75) Inventors: Sebastian Csutak, Austin, TX (US); Wei E. Wu, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 241 days.

(21) Appl. No.: 09/994,182

(22) Filed: Nov. 26, 2001

(65) Prior Publication Data

US 2002/0164143 A1 Nov. 7, 2002

Related U.S. Application Data

(63) Continuation-in-part of application No. 09/846,086, filed on May 2, 2001, now Pat. No. 6,633,716.

(51) Int. Cl.[7] .............................................. H01L 21/06
(52) U.S. Cl. ............................. 257/21; 257/21; 257/13
(58) Field of Search .............................. 257/21, 84, 98, 257/101, 432, 435, 222; 385/131

(56) References Cited

U.S. PATENT DOCUMENTS

| | | | |
|---|---|---|---|
| 5,026,148 A | 6/1991 | Wen et al. | |
| 5,337,183 A | 8/1994 | Rosenblatt | |
| 5,352,919 A | 10/1994 | Takano | |
| 6,204,524 B1 * | 3/2001 | Rhodes | 257/222 |
| 6,633,716 B2 * | 10/2003 | Csutak | 385/131 |

FOREIGN PATENT DOCUMENTS

| | | |
|---|---|---|
| EP | 0448868 A1 | 10/1991 |
| EP | 0481552 A1 | 4/1992 |
| EP | 0763821 A1 | 3/1997 |

OTHER PUBLICATIONS

Weishu Wu et al., "Analysis of the effect of an electric–field profile on the gain–bandwidth product of avalanche photo-detectors", 1997 Optical Society of America, Aug. 1, 1997, vol. 22, No. 15, Optics Letters, pp. 1183–1185.

* cited by examiner

Primary Examiner—David Nelms
Assistant Examiner—Thinh T Nguyen
(74) Attorney, Agent, or Firm—Susan C. Hill; Kim-Marie Vo

(57) ABSTRACT

An optical device uses one or more doped pockets in one embodiment to increase the electric field at one or more edges of the light absorbing region to increase the efficiency of the optical device. In alternate embodiments, the optical device uses an overlying light-barrier layer to reduce optical absorption within the more highly doped region. Some embodiments use a comb-like structure for the optical device to reduce capacitance and create a planar CMOS compatible structure.

25 Claims, 10 Drawing Sheets

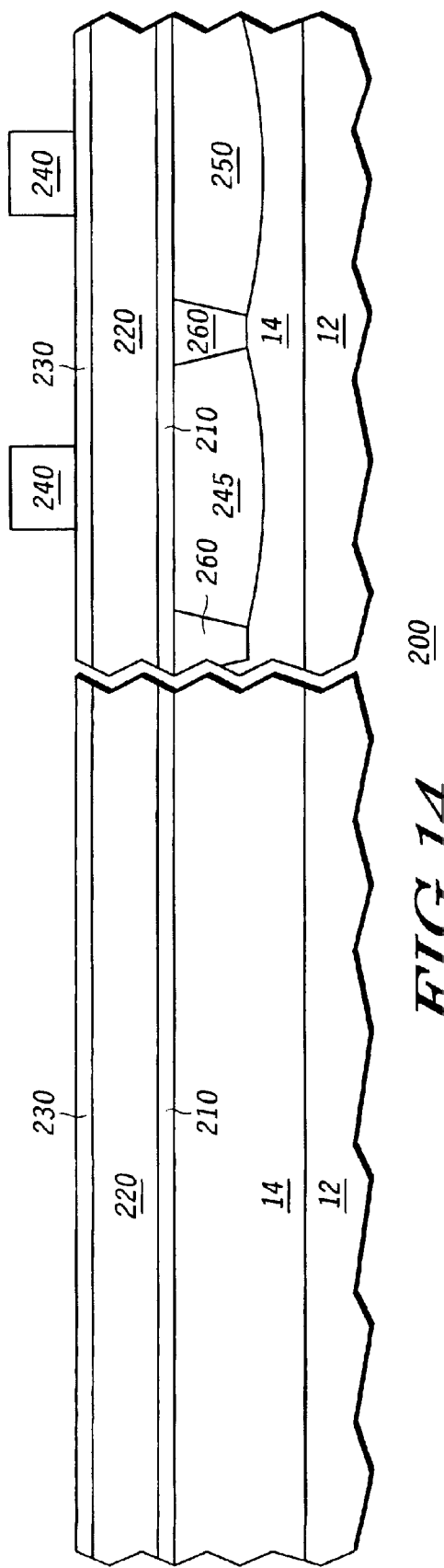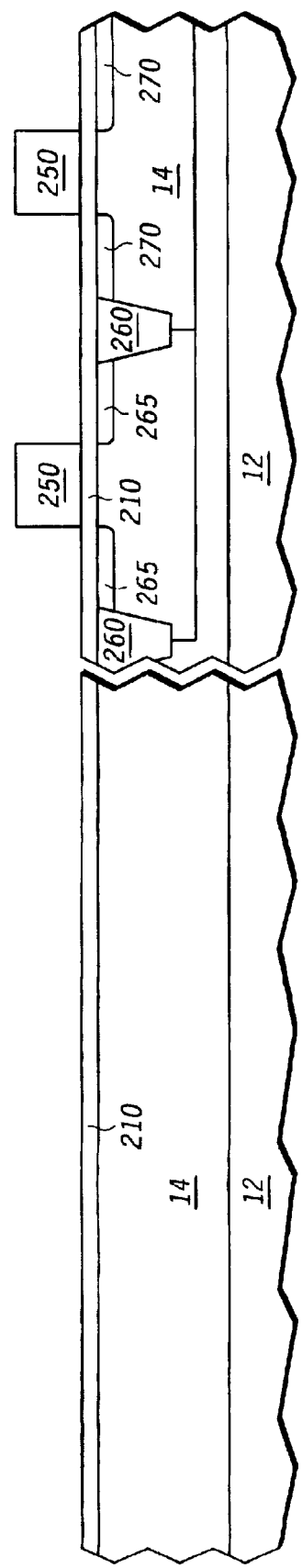

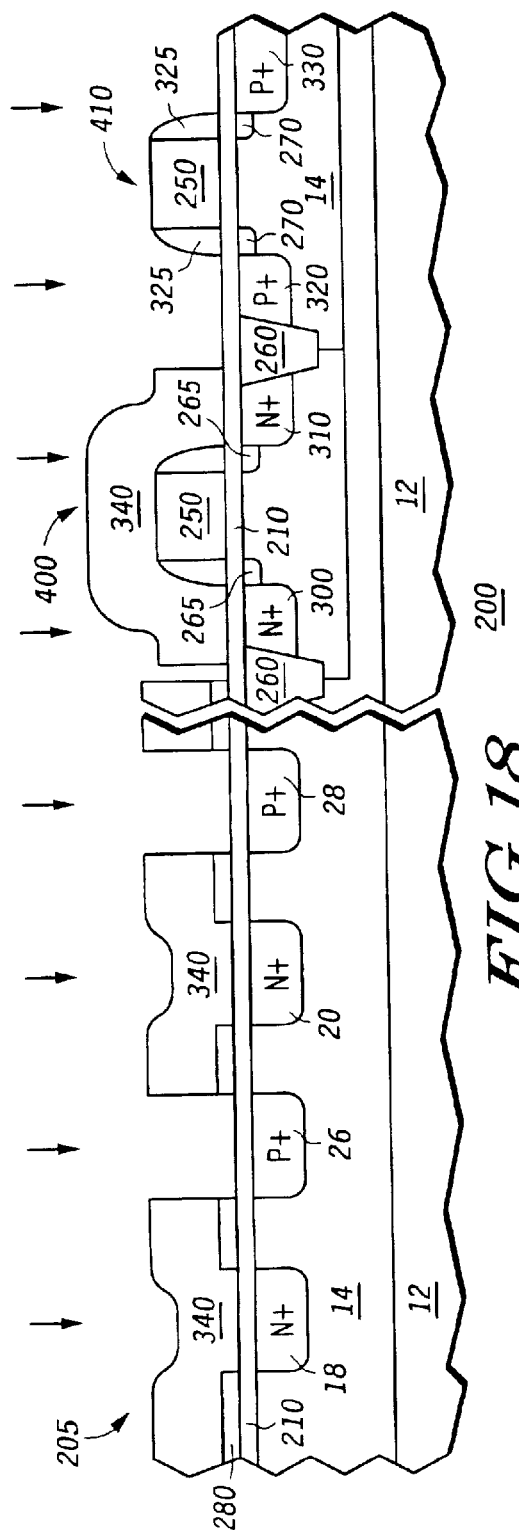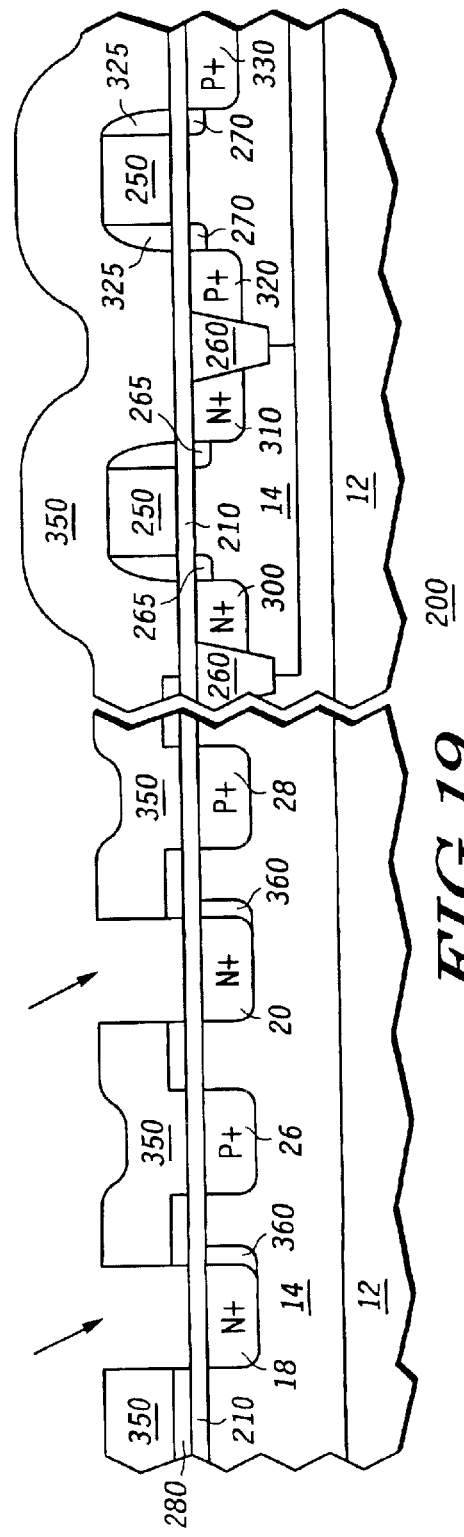

OPTICAL DEVICE AND METHOD THEREFOR

RELATED APPLICATIONS

This application is a continuation-in-part application of application Ser. No. 09/846,086, entitled "Optical Device and Method Therefor", filed May 2, 2001 now U.S. Pat. No. 6,633,716, and assigned to the assignee hereof.

FIELD OF THE INVENTION

The invention relates to optical devices and more particularly to photodetectors made as an integrated circuit.

RELATED ART

A continuing object of integrated circuit manufacturing is to increase the speed of operation. One of the issues relating to using integrated circuits is the interconnect with the integrated circuit itself. The interconnect itself has and creates speed limitations. Some of these relate to the physical interconnect and others relate to distances that must be covered by the signal that is either received or transmitted by the integrated circuit. One of the techniques that is being studied to improve this is the use of light as opposed to an electrical signal for the source of information for the integrated circuit. The typical integrated circuit has a silicon substrate, which does provide the capability, albeit a not very good one, of being a photodetector. One of the reasons silicon is not considered a particularly good photodetector is that its absorption coefficient is low compared to some other materials such as germanium.

The technique for detecting light using silicon or germanium is to detect carriers generated by the incident light. The incident light must be at frequency that is absorbed by the material as opposed to frequency at which the light is passed. In silicon the frequency of the light that is absorbed has a wavelength less than 1.1 microns, whereas frequencies with a wavelength greater than 1.1 microns are passed. One standard frequency below the 1.1 micron wavelength is the standard for local area networks (LAN), which has a wavelength of 850 nanometers. The light that has a frequency that can be absorbed by the silicon, which generates holes and electrons as the light penetrates and is adsorbed by the silicon. These carriers are then collected to perform the detection of the incident light using biased doped regions in the silicon. The bias is sufficient to fully deplete the substrate or well regions. The incident light carries the information that is to be processed by the integrated circuit.

The efficiency of the detector is increased if more of these carriers, which are generated by the light, can be collected. One of the difficulties with silicon is that about 98% of the carriers are generated over about 20 microns of distance, i.e., the light penetrates into the silicon about 20 microns before it is substantially fully adsorbed. It is difficult to collect most of these carriers, the 98%, rapidly. The electric field provided by the biased doped regions attracts the carriers. As the distance between the doped regions and the carriers increases, the electric field diminishes. These carriers that are in the low electric field areas are too slow in reaching the doped regions where they can be detected. The result is a rate of detection which is not a fast enough to provide a significant improvement over that available by using normal electrical signals.

To have the requisite speed of detection, the collectors of the carriers must be in closer proximity to the generation of the carriers. A technique for improving the speed was to isolate many of the carriers that were generated relatively far from the doped regions using conventional SOI type substrates. Thus, the incident light would generate carriers at the surface and continue generating carriers but most of the carriers would be generated below the insulating layer that is part of an SOI substrate. This improves the speed because only the carriers that were generated close to the electrodes reached the doped regions, but most of the carriers were generated below the insulating layer so that the detection itself was difficult. Detection typically includes biasing doped regions to attract the holes or electrons that are the carriers that are generated by the incident light. The fact that these doped regions are biased inherently makes it difficult to detect very small amounts of charge. Thus, the more charge that is available for detection, the more effective the detection will be.

Thus there is seen a need for a photodetector in a semiconductor that can be fast enough and reliable enough to detect signal information from light.

BRIEF DESCRIPTION OF THE DRAWINGS

The present invention is illustrated by way of example and not by limitation in the accompanying figures, in which like references indicate similar elements, and in which:

FIG. 14 is a cross section of a portion of the semiconductor substrate a cross section of a portion of an integrated circuit at a stage in processing according to another embodiment of the invention; and FIGS. 15–24 are cross sections of the semiconductor device of FIG. 14 after subsequent processing.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A photodetector, a type of optical device, is made using a semiconductor as an absorber and detector. At the surface of a substrate that has the semiconductor is a grating that is used to redirect the light. Below the silicon is an insulating layer so that the silicon operates as a waveguide. The incident light is redirected in the direction of the silicon. The detector is located in the silicon in the form of doped regions. Because the light is redirected so that it is contained within the silicon area, all the carriers that are generated are in close proximity to the doped regions, which operate as collectors of the carriers. This provides for an efficient photodetector that is both fast and provides for relative easy detection.

Figure 1:
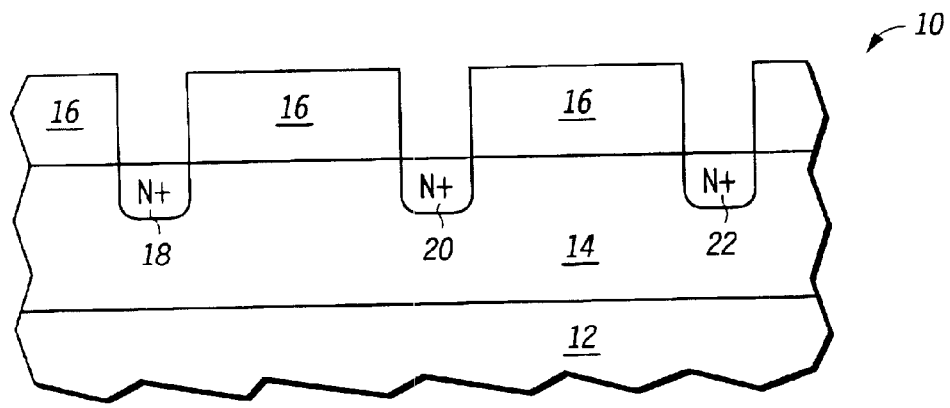
FIG. 1 is a cross section of a portion of an integrated circuit at a stage in processing according to an embodiment of the invention.

Shown in FIG. 1 is a portion of an integrated circuit 10 comprising a insulating region 12, a semiconductor region 14, a patterned photoresist 16, an N-doped region 18, an N-doped region 20, and an N-doped region 22. Pattern photoresist 16 results from patterning a photoresist layer which was deposited over semiconductor region 14. Typically an oxide layer, not shown, would be between the photoresist and the silicon. After patterning this photoresist layer, photoresist 16 is provided. An N+ implant then occurs to form N+ regions 18, 20 and 22. Insulating region 12 and semiconductor region 14 comprise a silicon on insulator (SOI) substrate, which is readily available in the industry.

Figure 2:
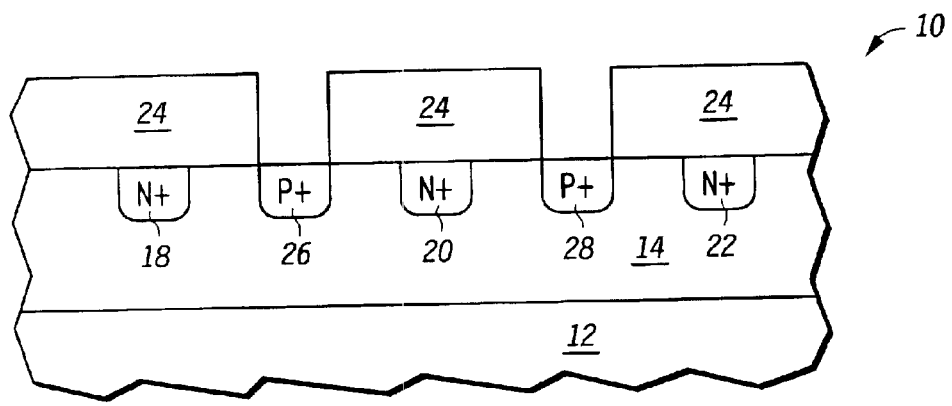
FIG. 2 is a cross section of the integrated circuit of FIG. 1 at a subsequent stage in processing.

Shown in FIG. 2 is integrated circuit 10 after pattern photoresist 16 has been deposited and another photoresist layer has been deposited and patterned to result in patterned photoresist layer 24. Pattern photoresist layer 24 provides as a mask for a P-type implant, which results in P-doped regions 26 and 28. P-doped regions 26 and 28 are interleaved between N-doped regions 18, 20 and 22.

Figure 3:
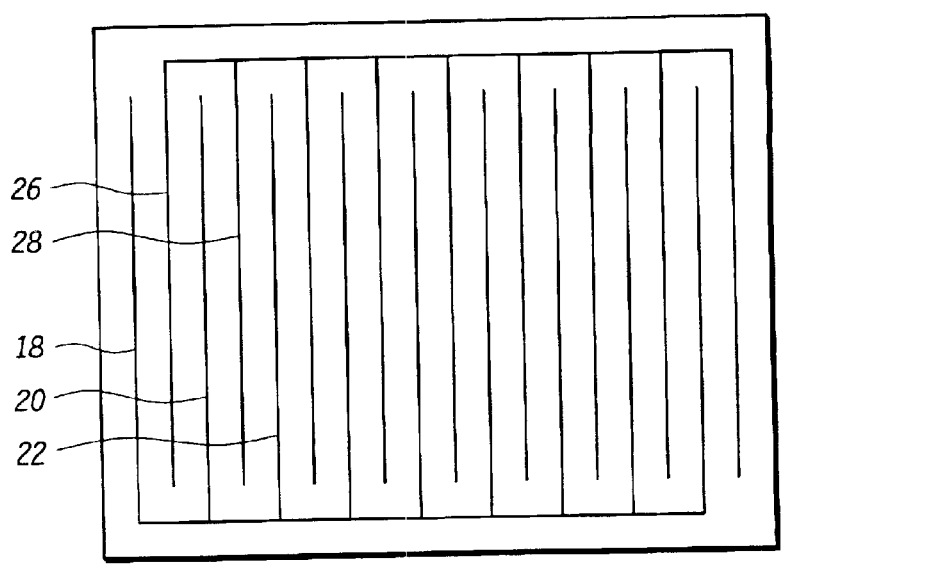
FIG. 3 is a top view of the integrated circuit of FIG. 2.

Shown in FIG. 3 is a top view of an additional portion of integrated circuit 10 showing the interleaving of N and P doped regions. This shows N-doped regions having a common connection at the bottom and P-doped regions having a common connection at the top. This portion of integrated circuit 10 shows the target area of incident light.

Figure 4:
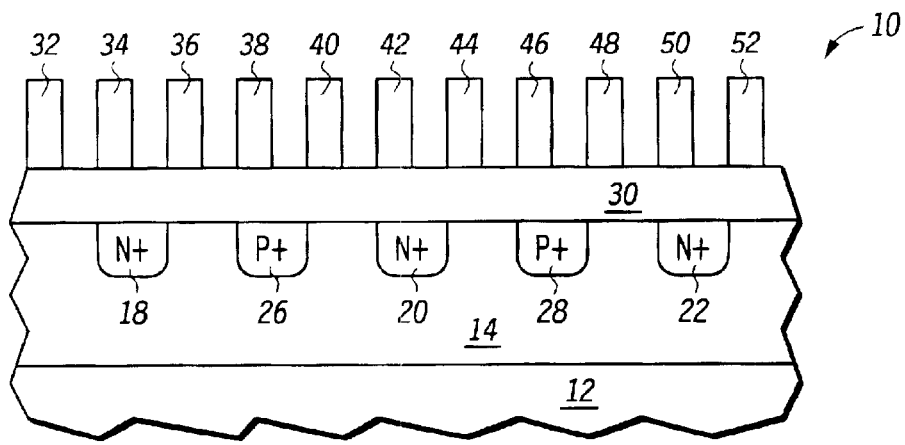
FIG. 4 is a cross section of integrated circuit of FIG. 2 at a subsequent stage in processing.
Figure 5:
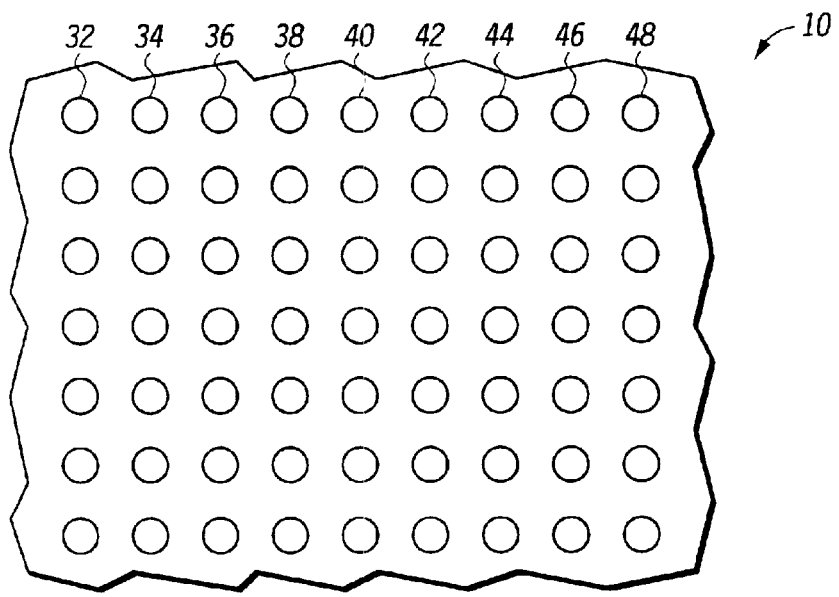
FIG. 5 is a top view of the integrated circuit of FIG. 4.

Shown in FIG. 4 is after additional processing of integrated circuit 10. A nitride layer 30 is deposited over semiconductor region 14. A photoresist layer is then deposited over nitride layer 30 and patterned to form a pattern photoresist layer comprising photoresist pillars 32, 34, 36, 38, 40, 42, 44, 46, 48, 50 and 52. These pillars 32–52 are substantially cylindrical in shape, which is reasonably easy to achieve. Shown in FIG. 5 is a portion of integrated circuit 110, as a top view at the stage in processing shown in FIG. 4., which shows the pillars in a matrix fashion.

Figure 6:
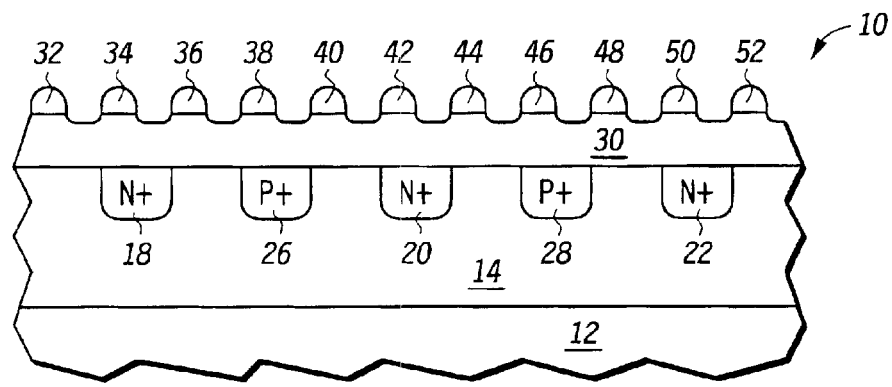
FIG. 6 is a cross section of the integrated circuit of FIG. 4 at a subsequent stage in processing.
Figure 7:
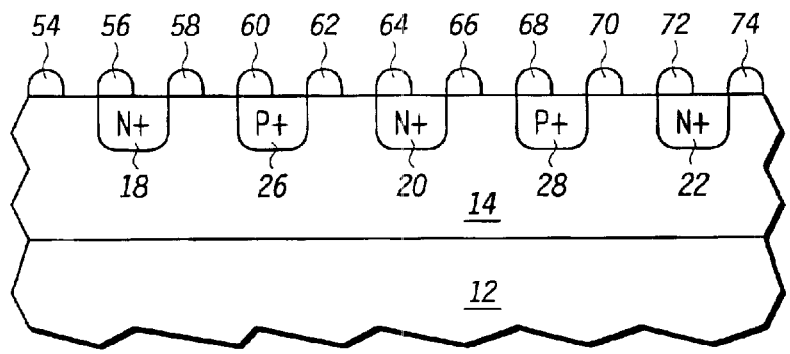
FIG. 7 is a cross section of a integrated circuit of FIG. 6 at a subsequent stage in processing.

Shown in FIG. 6 is integrated circuit 10 at a stage in processing after a partial etch of photoresist pillars 32–48 and nitride layer 30. This shows that pillars 32–52 are not only being reduced in height but also being reduced in diameter. The etch of the nitride is directional but the photoresist is nonetheless etched laterally as well so that the photoresist pillars, whose sidewalls are exposed, are reduced in diameter to expose more and more of the nitride. But the nitride that has received the maximum exposure is that area which is between the original pillars. As the pillars decline in diameter additional nitride is exposed. Thus, there is a slope formed in the nitride toward the photoresist. The etch of the nitride between photoresist pillars continues and the result is shown in FIG. 7. This shows hemispherical shaped nitride features 54, 56, 58, 60, 62, 64, 66, 68, 70, 72 and 74. These nitride features are positioned to have a periodicity chosen for the frequency that is desired to be passed between semiconductor region 14 and an area above nitride features 54–74. Nitride features 54-74 comprise an optocoupling grating.

Semiconductor region 14 operates as a waveguide with nitride features 54-74 operating as the opto-coupling diffraction grating. The silicon of semiconductor region 14 has a higher index of refraction than the silicon oxide of insulating layer 12. Another insulating layer may also be used which has a lower index of refraction than that of the semiconductor layer above it. The nitride features also have a lower index of refraction than the semiconductor layer 14.

There is a dimension of periodicity of the nitride features that will result in light traveling laterally in patterned semiconductor region 14 which will also pass through the diffraction grating of nitride features 54–74. The typical angle of incident of light with respect to the opt-coupling grating is 80 degrees plus or minus 5. Thus, it is near vertical but not quite. The periodicity of nitride features 54–74 is selected based upon the frequency of the incident light at nominally 80 degrees. A typical and standard frequency for local area networks (LAN) is light with a wavelength of about 850 nanometers (nm) for the nominal angle of 80 degrees for the light entering the opto-coupling diffraction grating. The period using nitride for the grating is about 290 nanometers (nm). At this wavelength of 850 nm light is absorbed by silicon so the intended use is as a photodetector with the benefit of very good efficiency. The doped regions 18–22 and 26–28 are used to collect the photo-generated carriers.

This diffraction grating can also be used at for a wavelength of 1310 nm, which is the standard for metropolitan area network, but would be used as a transmitter with silicon as the waveguide as is the case shown in FIG. 7 for which semiconductor region 14 is described as being silicon. Semiconductor region 14 may, however, be a different composition that would make it sensitive to 1310 nm radiation. One way to do this is to alloy the silicon with germanium.

An advantage of the hemispherical shape is that the efficiency of coupling is not significantly affected by the polarization of the incident light. Thus, non-polarized light will pass very well through the opto-coupling grating in which the individual features are hemispherical. If instead of using a matrix of small features, a number of fingers that are in parallel with each other are used, the bending is effective based upon the periodicity of the fingers but the coupling is only good for the light that is polarized in the direction of the fingers. The light which has polarization aligned perpendicular to the features is substantially blocked.

Figure 10:
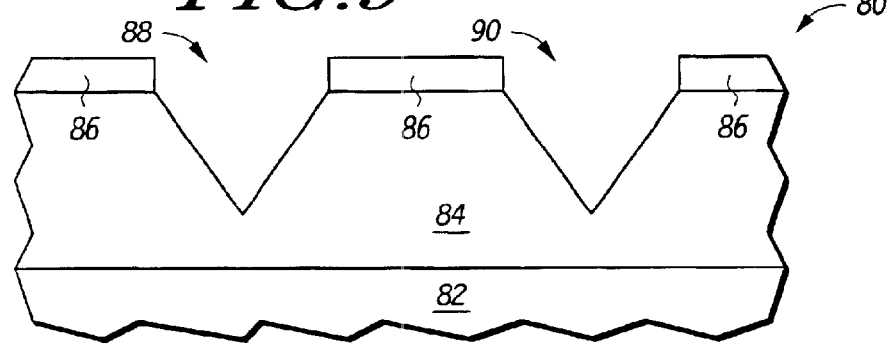
Figure 11:
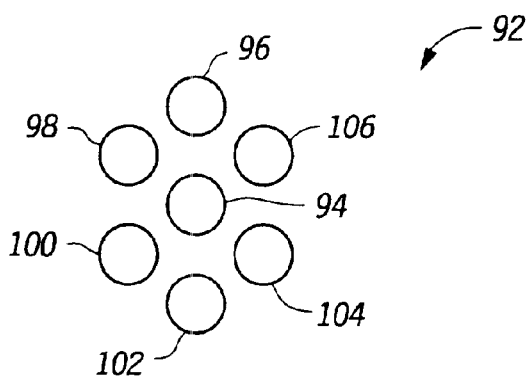
FIG. 11 is a top view of an arrangement of grating features according to an embodiment of the invention.

An alternative to the square matrix shown for example, in FIG. 5, is to have each photoresist pillar be of equal distance from the others. This would be six pillars equidistant from any other pillar, as shown in FIG. 10. This could be called a hexagonal pattern because it would be six pillars equidistant from any other pillar. This may be the most effective for passing non-polarized light and is mostly usefully implemented if the diffraction features, such as nitride pillars 54-74, are round. Shown in FIG. 11 is hexagonal pattern 92 comprised of round diffraction features 96, 98, 100, 102, 104, and 106, which surround diffraction feature 94 with a radius that is equal to the desired period for the grating to achieve the desired bending for the particular frequency.

The purpose of N-doped regions and P-doped regions such as 18–22 and 26–28 is to collect electrons for the case of N-doped regions and collect holes for the P+ regions. Semiconductor region 14 is doped very lightly to P−, a typical starting material for an integrated circuit but even lower doping levels may be even more advantageous. The use of an etchant, which directionally attacks the nitride layer 30 while simultaneously etching the sidewall of the photoresist pillar is used to advantage to obtain the round shape. This is a desirable shape that provides for a matrix such as shown in FIG. 5 or for the hexagonal approach of FIG. 10, which provides equal distance for all of the ultimate nitride features that make up the grating that then can maximize the coupling. The hexagonal pattern provides for the optimal symmetry, which provide the desired periodicity. The distance between two neighboring features plus the diameter of one of the features is the measure of the period.

Figure 8:
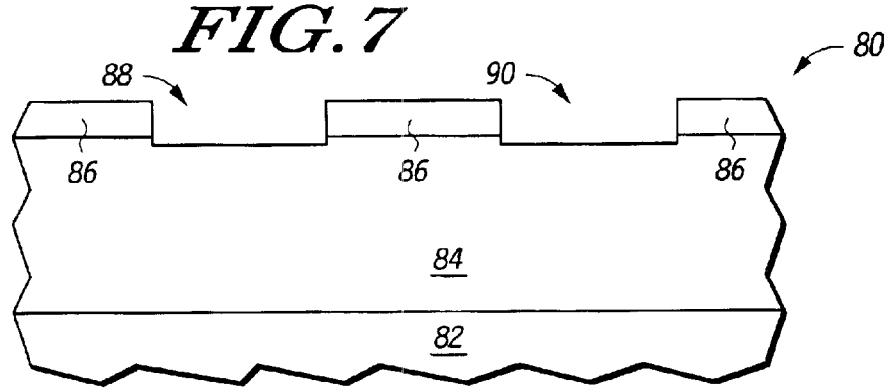
FIG. 8 is a cross section of an integrated circuit at a stage in processing according to an alternative embodiment.

As an alternative to the hemispherical grating features, such as nitride features 54–74 which protrude above the semiconductor region 14, the grating features may also be cavities in the semiconductor region. Shown in FIG. 8 is a portion of an integrated circuit 80 having a semiconductor region 84, which in the present embodiment is silicon, and insulating region 82, a patterned nitride layer 86 with openings 88 and 90 in the nitride. Also, this is achieved by applying photoresist, patterning the photoresist, and then etching the nitride according to the pattern in the photoresist. This leaves openings 88 and 90. Openings 88 and 90 are then roughed by an ion bombardment. This lowers the level of silicon in openings 88 and 90 slightly as well as roughening the surface of the silicon at openings 88 and 90. After the ion bombardment of openings 88 and 90, an etch comprised of potassium hydroxide (KOH) in liquid form is performed. With the crystal structure of silicon, a wet KOH etch is anisotropic. This etch is along the 111 plane of the silicon, substrate 84. The result is a pyramid shape removed from the silicon in openings 88 and 90.

Figure 9:
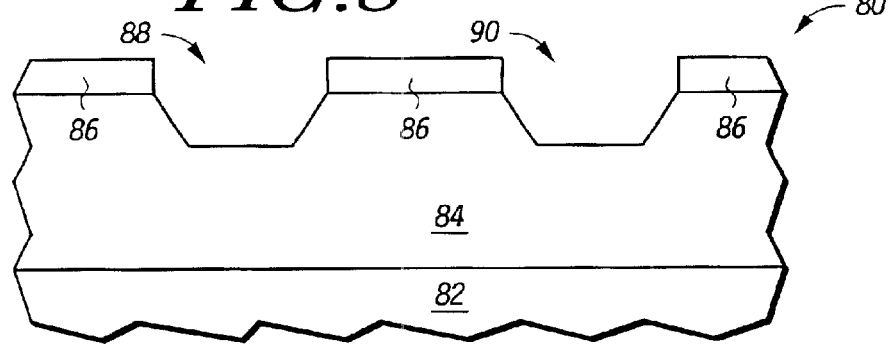
FIGS. 9–10 are a cross sections of an integrated circuit of FIG. 8 at subsequent stages in processing.

Shown in FIG. 9 is a stage in the processing using the wet KOH etch to etch at the angle shown and is along the 111 plane of silicon region 84. The etch continues with the result shown in FIG. 10, which is a pyramid-shaped cavity in semiconductor region 82. This is an advantageous process because it is highly repeatable. The etching will essentially stop once the pyramid is formed. The etch rate is extremely slow into the 111 plane but rapid along it. Thus, what is left is the silicon aligned in the 111 direction. These pyramids thus can replace the nitride features that protrude above the silicon surface and instead be cavities within the silicon region. The pyramid-shaped features, which are surrounded by air, form a layer with a lower average index of refraction than silicon. Thus the silicon, substrate 84, is effective as a waveguide because it has a lower index of refraction both above and below it.

The period of these pyramid shapes can be achieved as desired. The period in this case is the distance between openings 88 and 90 plus the length of one of these openings shown in FIG. 9. These pyramids shapes can be aligned in the matrix shown in FIG. 5 for the photoresist pillars. If integrated circuit 10 is used as a photodetector, the doped regions would be conveniently placed to optimize the collection of carriers generated by the incident light.

Figure 12:
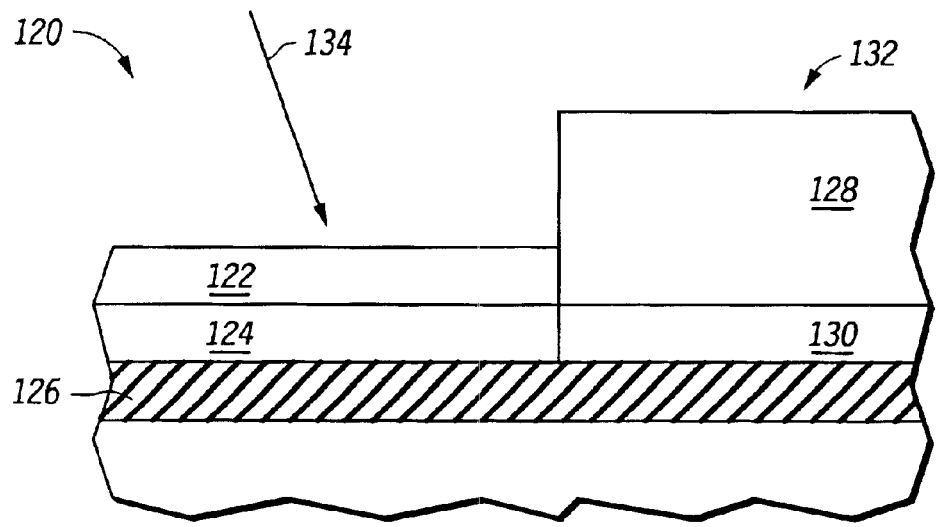
FIG. 12 is a cross section of the semiconductor substrate having a photodetector and processing circuitry according to a preferred embodiment of the present invention.

Shown in FIG. 12 is an integrated circuit 120 comprising a grating 122, a detector 124, an insulator 126, gates and interconnect 128, and sources and drains 130. Integrated circuit 120 utilizes a conventional semiconductor-on-insulator (SOI) substrate in which the semiconductor is preferably silicon and insulator 126 is below the silicon. The silicon is the active region of integrated circuit 120 and is where detector 124 and drains and sources 130 are located. The silicon corresponds to semiconductor region 14 shown in FIG. 2. The regions doped regions 18–22 and 26–28 are relatively highly doped compared to the rest of semiconductor region 14, which is lightly doped to less than or equal to about $10^{14}$ atoms/cm$^2$. The A relatively thick layer of silicon underlies insulator 126 primarily to provide physical support. Detector 124 is formed in the silicon above insulator 126. Grating 122 is formed above the silicon substrate surface although, as an alternative, the grating may be formed as part of the silicon itself. Gates and interconnect 128 are formed above the silicon surface which in this case is coincident with top of detector 124. Sources and drains 130 are formed in the silicon surface. The combination of gates and interconnect 128 and sources and drains 130 form processing circuitry 132, which utilizes information collected by detector 124. In one embodiment, processing circuitry 132 is gates, interconnects and source and drain regions. In operation, incoming light 134 strikes grating 122 and generates in the silicon carriers that are detected by detector 124. After detection by detector 124, processing circuitry 132 processes this detected signal in a manner according to a chosen design.

Figure 13:
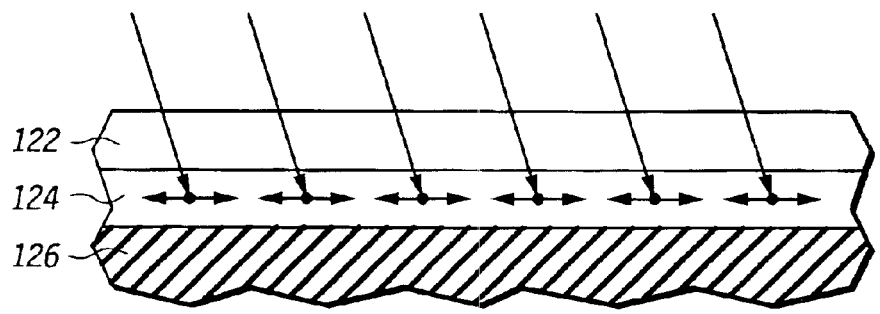
FIG. 13 is a cross section of a portion of the detector shown in FIG. 12.

Shown in FIG. 13 is grating 122, detector 124, and insulator 126 showing the action of incident light on grating 122. This shows that the incident light is striking the grating area, that it enters detector area 124, and that it stays in the area of detector 124. Area between grating 122 and insulator 126 is a waveguide so that the light that enters this waveguide remains there. Thus, detector 124 is in close proximity to the carriers that are created by incident light entering the silicon. Because of grating 122, the incident light is redirected so that it is contained within the waveguide. This results in all the carriers being generated in the waveguide. The detector is also located in the waveguide so that the detector is in close proximity to the areas where the carriers are generated. This results in short distances for the carriers so that are in the relatively strong electric field region of the doped regions that make up the detector. Thus, there is no speed problem in the collection portion of operation.

Also, with all the incident light being contained within range of the detectors, the efficiency is very high. This provides a benefit of ease of detection of the information containing in the incoming light. Grating 122 can be chosen from any of those described in the formation of a grating described for FIGS. 1–11. For example, grating 122 may be the nitride features 54–74 shown in FIG. 7. In the alternative they may be inverted pyramids such as 88 and 90, which are actually formed in the silicon. Detector 124 may be like that shown in FIGS. 2, 3, 4, 6, and 7.

The desired angle of incident light 134 is chosen to optimize the efficiency of transmitting the light into the waveguide created between grating 122 and insulator 126. If 90-degree incident light is utilized then the light entering waveguide would also be 90 degrees in both directions shown in FIG. 13 and actually radially in all directions. This may be preferable. It may also be preferable to have the light come in on one portion of the grating at an angle so that it only goes into the waveguide in one direction or at least not in all directions. The grating area and the detector area in most cases would be generally the same size. The incoming light will have a spot size as well. It's desirable for efficiency for the grating and the detector to be larger than the spot size of the incident light. Thus it may be desirable for the spot to be received on one side of the grating and angled to the other side of the grating so that all the light is directed towards the side of the grating away from where the spot is received. In the alternative, especially if the light is received at 90 degrees, the beam spot would be desirably located in the middle of the grating.

Gates and interconnect 128 are depicted as a block above the silicon portion of the substrate. This is depicting a typical configuration of an integrated circuit made on silicon. The transistors are a combination of the gates that are above the silicon and sources and drains are in the silicon. The combination of sources and drains and gates and interconnects are the tools by which integrated circuits are typically made. These integrated circuits can be quite simple or they can be extremely complex such as a microcomputer or microprocessor. They can have a variety of functions as well such as memory, digital to analog converters, and amplifiers. This is shown to indicate the planned integration of a photodetector with normal integrated circuit structures. The information retrieved by detector 124 may be transmitted to processing circuitry 132 by a source and drain type of interconnect or it may be achieved by an above substrate interconnect such as metal or polysilicon.

The thicknesses of the insulator and detector and the height of the grating are chosen in relation to the frequency of the incident light. The spacing of the grating features is also chosen in relation to the frequency. In the present example, the expected frequency corresponds to a wavelength of 850 nm. The thickness of insulator 126 is chosen to be an odd multiple of a quarter optical wavelength of the light with respect to insulator 126. Thus, the index of refraction must be taken into account. In this case insulator 126 is preferably silicon oxide, which has an index of refraction of 1.45. Thus the thickness of insulator 126 is preferably about one fourth of 850 nm divided by 1.45, which is about 146 nm, or odd multiples of this number.

Similarly, the sum of the thicknesses of the waveguide and the grating, which is shown in FIG. 12 as detector 124 and grating 122, is one half of the optical wavelength or even multiples of this number. The average index of refraction of the silicon waveguide and the average index of refraction of the grating must be taken into account. In the case of the grating, the index of refraction of air must be averaged with the material that forms the grating feature. This averaging must take into account the square relationship required for averaging indexes of refraction. The waveguide is silicon with an index of refraction of 3.62. For a simple example where the volume of features is the same as the volume of air in the grating and the features are silicon, the average index of refraction equals the square root of the quantity of the square of 3.62 plus the square of 1 all divided by 2. Thus the index of refraction is the square root of 13.1 plus 1 divided by two, which equals the square root of 7.05, which equals 2.65. Thus, the thickness of the waveguide times 3.62 plus the height of the grating times 2.65 equals one half of 850 nm. A benefit of this approach is that the thickness of the waveguide and the height of the grating can be varied so long as this condition is met.

Shown in FIG. 14 is a second integrated circuit 200 or lateral optical device formed on a semiconductor substrate. The second integrated circuit 200 includes the insulating layer 12, the semiconductor region 14, a gate dielectric layer 210, a gate electrode layer 220 and an anti-reflective coating (ARC) layer 230, which is optimized for minimizing photolithographic wavelength reflection. After subsequent processing the second integrated circuit 200 will include both a photodetector 205 and transistors 400 and 410. Within the semiconductor region 14 is a P-well 245 and an N-well 255 separated by trench 260. The trenches 260 can be formed by shallow trench isolation (STI) or local oxidation of silicon (LOCOS). After the trenches 260 are formed within the semiconductor region 14, a photoresist is deposited and patterned in order to implant the P-well 245. The P-well 245 can be implanted using a chain (sequential) implant of boron of three sequential implants using the following energy and doses: 350 KeV and 8E12 atoms of boron per centimeter cubed, 200 KeV and 4E12 atoms of boron per centimeter cubed, and 15 KeV and 5E12 atoms of boron per centimeter cubed. Another process and/or P-type dopant may be used.

Afterwards the photoresist is removed and another photoresist layer is formed to mask at least the P-well area. Ion implantation is performed to form N-well 255. Typical implant conditions for the N wells are an energy of 600 KeV with a dosage of $7.2\times10^{13}$ atoms of phosphorus per centimeter cubed, an energy of 450 KeV with a dosage of $4.5\times10^{12}$ atoms of arsenic per centimeter cubed, and an energy of 200 KeV with a dosage $7.5\times10^{12}$ atoms of antimony per centimeter cubed. After forming the wells 245 and 255, a gate dielectric layer 210 is deposited using chemical vapor deposition (CVD), physical vapor deposition (PVD), atomic layer deposition (ALD), high-density plasma deposition (HDP), the like or combinations of the above. The gate dielectric layer 210 can be silicon dioxide or a high dielectric constant (high-k) material such as hafnium oxide, zirconium oxide, aluminum oxide or any other suitable gate oxide material. The gate electrode layer 220 is deposited over the gate dielectric layer 210 using CVD, PVD, ALD, the like or combinations of the above. In a preferred embodiment, the gate electrode layer 220 is polysilicon, however, other conducting materials can be used. The ARC layer 230 is also deposited over the gate electrode layer 220 by any deposition process such as CVD, PVD, ALD, the like or combinations of the above. In a preferred embodiment, the ARC layer is silicon nitride due to this material's common usage as an ARC layer; any other suitable material may be used. A patterned photoresist layer 240 is then formed over the ARC layer 230 in order to subsequently form the gate electrode as will become evident below. The ARC layer 230 and the gate electrode layer 210 are patterned.

After patterning, the patterned ARC layer is removed resulting in the gate electrodes 250 as shown in FIG. 15. Next, N regions 265 and P regions 270 are implanted to form extensions. To form N regions 265, the process can be an implantation of arsenic with an energy of about 1–10 keV and a dose of approximately 1E13 to 1E14 atoms per centimeter cubed. However, for P regions 270 $BF_2$ can be implanted at an energy of approximately 1-10 keV with a dose of approximately 1E13 to 1E14 atoms per centimeter cubed. Other doping conditions may be used.

Figure 16:
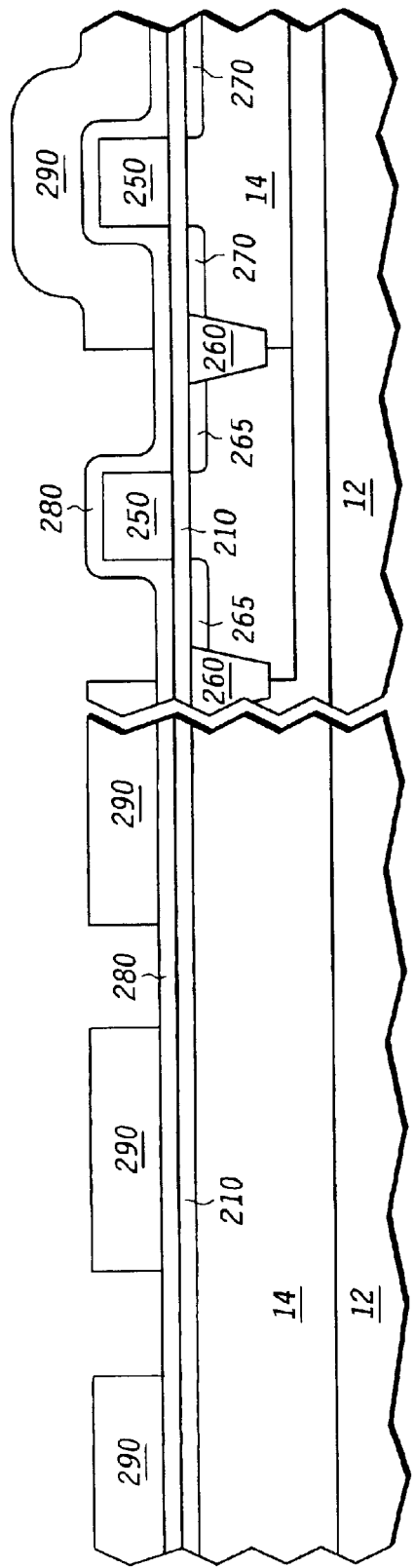

Shown in FIG. 16, a nitride layer 280 is formed over the second integrated circuit 200 by CVD, PVD or the like. Although silicon nitride is a preferred material, the nitride layer 280 can be any other material that is insulating, can be selectively dry etched relative to the gate dielectric layer 210 and will not forms a silicide. Optionally, a silicon dioxide layer such as one formed using tetraethylorthosilicate (TEOS) may lie underneath the nitride and be used as an etch stop during subsequent patterning of the nitride layer. The TEOS may be present and remain from the previous formation of spacers around transistors' gates if nitride spacers are formed over a TEOS liner, which is used as an etch stop. A patterned photoresist layer 290 is formed over portions of the second integrated circuit.

Figure 17:
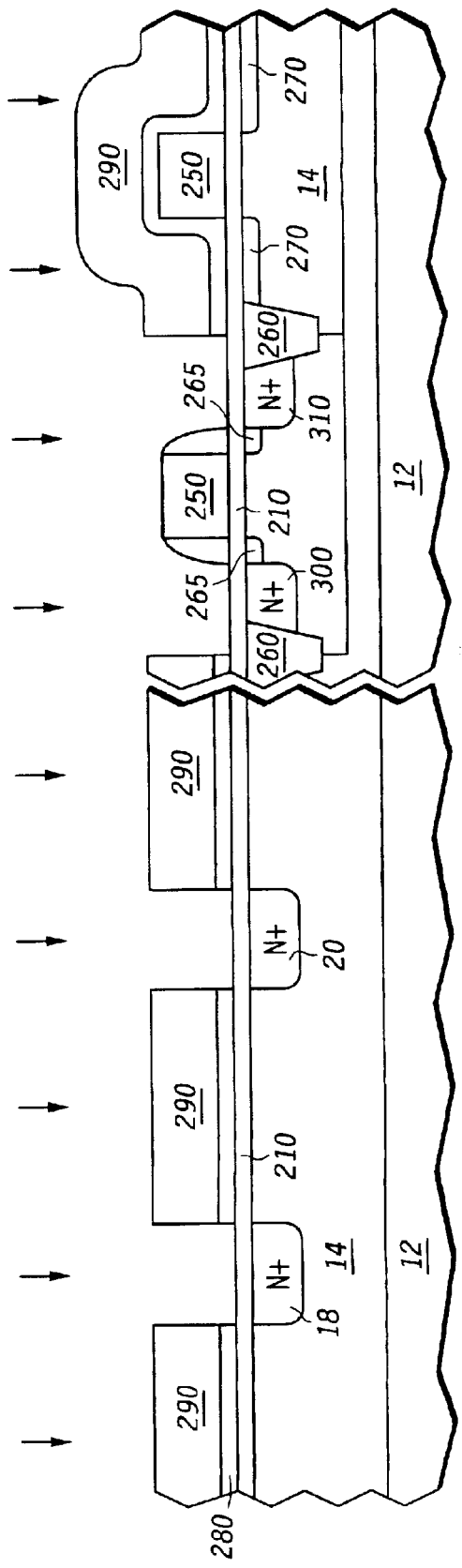

Shown in FIG. 17, portions of the nitride layer 280 that are exposed by the patterned photoresist layer 290 are removed resulting in spacers 312 and exposed areas of the gate dielectric layer 210. The nitride layer 280 is anisotropically etched (dry etched) in order to form spacers 312. An implant is performed which is blocked by the patterned photoresist layer 290, where present, and travels through the portions of the exposed gate dielectric layer 210 to form N+ regions 18, 20, 300 and 310. The doping concentration used to form the N+ regions 18, 20, 300 and 310 is a greater dosage than that used to form the extensions 265. For example, a dosage of approximately $3 \times 10^{15}$ atoms per centimeter cubed at an energy of 30 KeV can be used. The ion implantation for the N+ region 18, 20, 300 and 310 is performed without any tilt. The N-regions 300 and 260 will form the source regions for the first or NMOS transistor 400 and the N region 310 and extension 265 forms the drain region for the first transistor 400. The N+ regions 18 and 20 form the N-type electrodes of a photodetector 205.

Shown in FIG. 18, after forming the N+ regions 18, 20, 300, and 310, the patterned photoresist 290 is removed and another patterned photoresist layer 340 is formed over the N+ regions 18 and 20, portions of the nitride layer 280 and the first transistor 400 in order to form P+regions. The processing sequence is similar to that for forming N+ regions 18, 20, 300 and 310. Portions of the nitride layer 280 that are exposed by the patterned photoresist layer 340 are removed resulting in exposed areas of the gate dielectric layer 210 and spacers 315. The nitride layer 280 is anisotropically etched to form spacers 325. An implant is performed which is blocked by the patterned photoresist layer 340, where present, and travels through the portions of the exposed gate dielectric layer 210 to form P+regions 26, 28, 320 and 330. The P+ regions 26 and 28 form the P-type electrodes of the photodetector 205. The P-type regions 320 and 270 form the source regions for the second or PMOS transistor 410 and the P-type regions 330 and 270 form the drain regions for the second transistor 410. The energy used for the ion implantation of the P+ species can be an energy of 5 KeV with a dopant concentration of $2.5 \times 10^{15}$ atoms of boron per centimeter cubed, for example.

Shown in FIG. 19 is a patterned photoresist layer 350 that exposes the N+ regions 18 and 20. An ion implantation process is performed to form P regions or P-type pockets 360 which are doped less than the P+ regions 26 and 28 and, in one embodiment, are doped approximately the same concentration as the extension regions 270. The P-type pockets 360 are adjacent to the N+ regions 18 and 20, and, in one embodiment, are in contact with the N+ regions 18 and 20. In other words, the P-type pockets 360 are between the N+ region 20 and P+ region 28 or the N+ region 18 and the P+ region 26. The ion implantation is performed at a tilt, which in one embodiment is 35 degrees relative to an imaginary axis, which is substantially perpendicular to the surface of the semiconductor substrate. In addition, the energy used for the ion implantation is equivalent to that used for the previous implants to form the source and drain regions in the PMOS transistor 410. However, the dosage used for the tilted ion implantation is at least one order of magnitude less than that used for the non-tilted implants.

Figure 20:
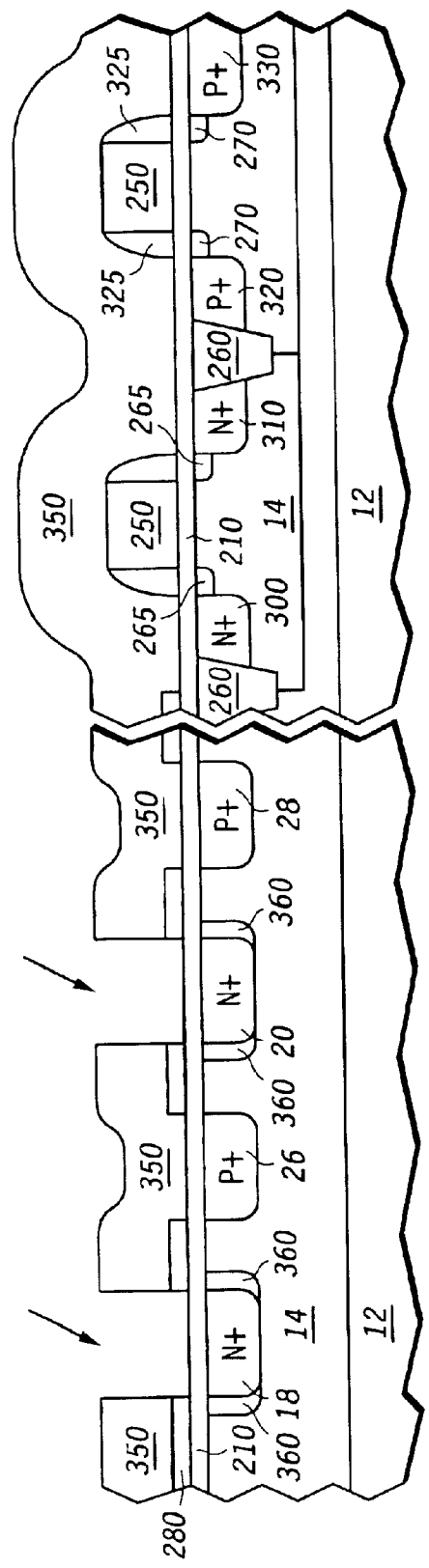
Figure 21:
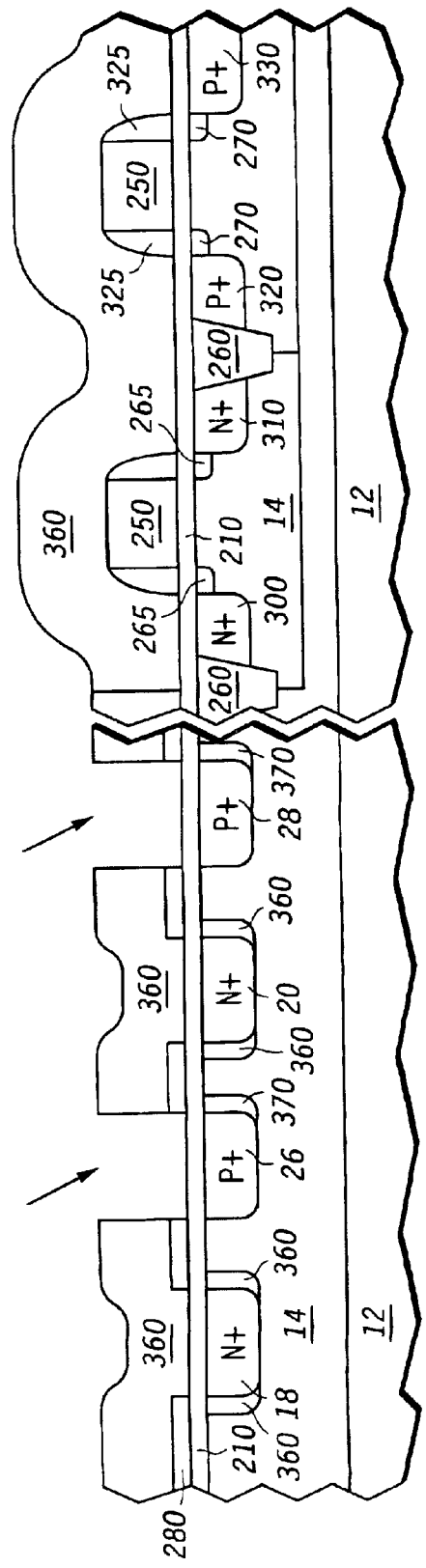

As shown in FIG. 20, another P+ tilted ion implant is performed to form pockets 360 on the other sides of the N-well regions 18 and 20. In order to decrease cycle time for the two P+ tilted ion implants, the same conditions can be used, thus avoiding resetting the tool or using a different tool. Therefore, the wafer can be rotated to perform the two P+ titled implants. The two tilted ion implants discussed can be part of a quad implant process meaning that the wafer is rotated during the tilt ion implantation process in four different directions in order to form the pockets 360 adjacent to the N-well regions 18. (Two ion implants are performed since only one direction within the second integrated circuit 200 is shown. There may be a need to perform two additional P+ tilted implants in order to form P-type pockets in the direction not shown in the figures and, thus, a quad implant process could be used.) Shown in FIG. 21 after removing the patterned photoresist layer 350, another patterned photoresist layer 365 is formed to expose the P+ regions 26 and 28. Tilted ion implantations similar to those described in regards to FIGS. 19 and 20 are used to form N doped regions 370 herein referred to as N-type pockets 370. Similar to the P-type pockets 360, the N-type pockets 370 have a dosage approximately equal to the dosage used to form the N-type extensions 265 for the second transistor 410. Although an N-type pocket is shown to be formed within the trench 260 that is adjacent to the P+ region 28, an N-type pocket may not be present. Its presence is not important since the N-type pocket is within an isolation region and, therefore, will not affect the functionality of the photodetector 205. The presence of an N-type pocket 370 within the trench 260 depends on whether or not the patterned photoresist layer 365 extends over a portion of the P+ region 28. In the embodiment shown in FIG. 21, the pattern photoresist layer 365 does not overlap the P+ region 28 and therefore an N-type pocket 370 exists within the trench region 260. A skilled artisan recognized that if the patterned photoresist layer 365 overlaps the P+regions 28, an N-type pocket 370 will not exist within the trench region 260.

Figure 22:
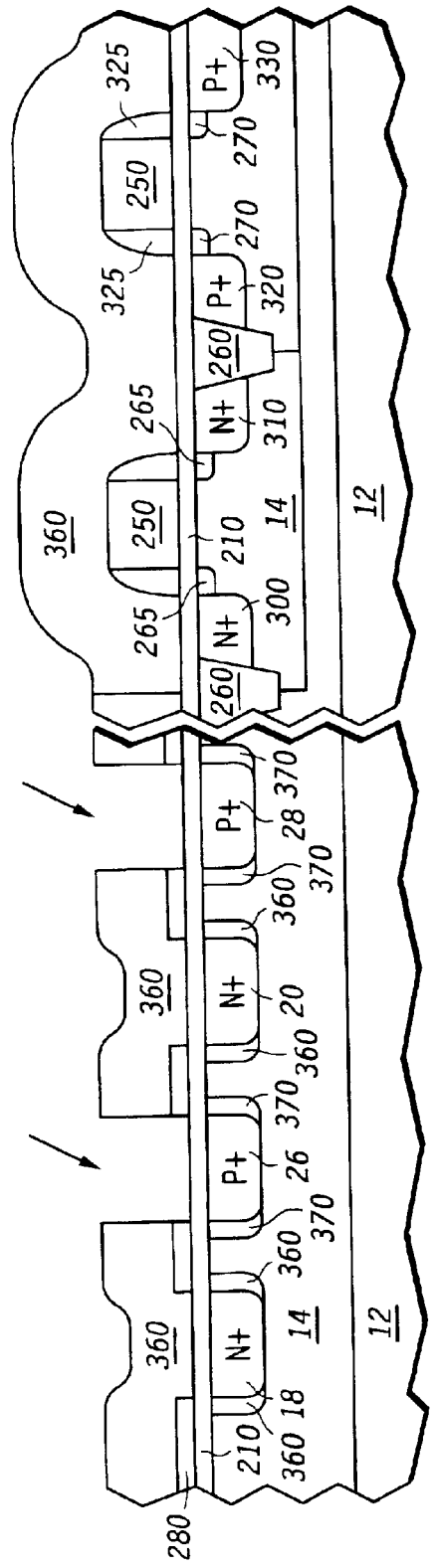

Shown in FIG. 22 another N-type ion implantation is performed using a tilt to form the N-type pockets 370 on the other side of the P-type regions 28 and 26. The two tilted ion implants discussed in regards to FIGS. 21 and 22 can be part of a quad implant process as previously discussed in regards to the P-type tilted implantation.

The pockets 360 and 370 of the photodetector 205 increase the magnitude of the electric field adjacent to the N+ regions 18 and 20 and the P+regions 26 and 28 allowing for an increase in the number of electrons or holes that are formed due to avalanche breakdown.

It is possible to alter the ion implantation processes used to form the pockets 360 and 370 in order to increase the number of electrons that are formed by avalanche breakdown and decrease the number of holes that are formed. Reducing the number of holes and increasing the number of electrons is desirable, because the presence of holes increases the amount of noise in the photodetector. In one embodiment, only the P-type pockets 360 are formed in order to increase the number of electrons that are multiplied during avalanche breakdown and decrease the number of holes that are multiplied. Silicon naturally multiplies more electrons during avalanche breakdown than holes, thus the pocket 360 and 370 can be used to enhance the efficiency of this process or, as previously discussed, can be used to alter the multiplication factor of the electrodes and holes that are formed during avalanche breakdown.

After ion implantation the gate dielectric layer 210 is patterned and etched to form gate oxide for the first transistor 400, the second transistor 410 and to expose the doped regions 18, 26, 20, and 28 of the photodetector 205. The resulting structure with subsequent processing is show in FIGS. 23 and 24.

Figure 23:
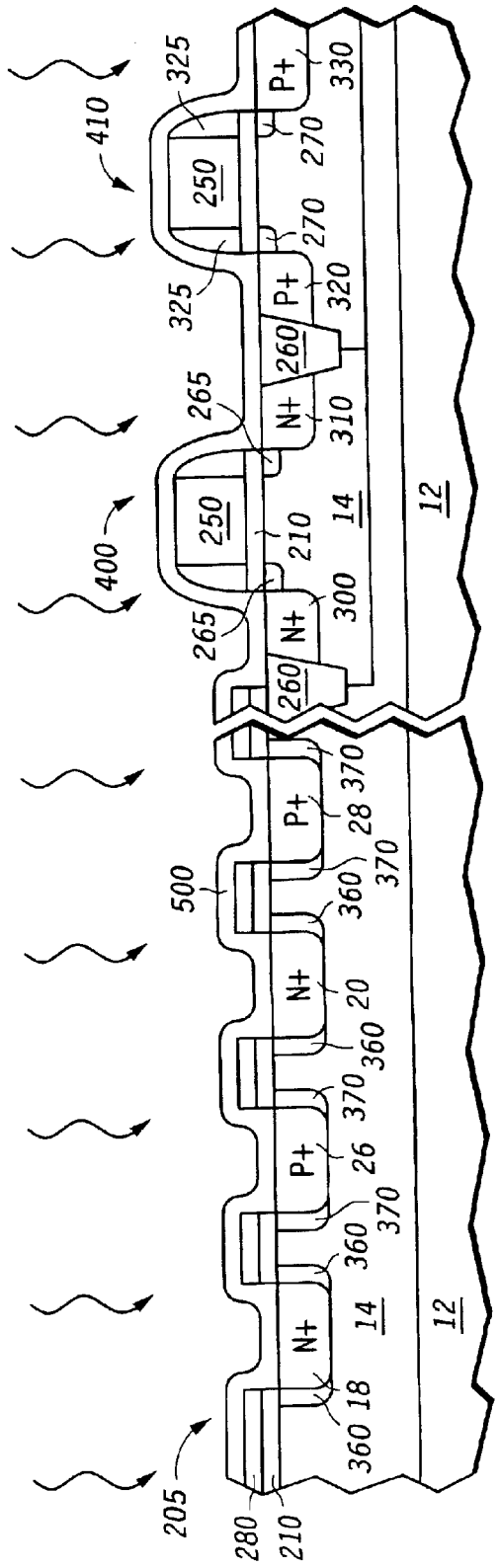

Shown in FIG. 23, a metal layer 500 which can be a metal stack of 150 Angstroms of cobalt underneath a 100 Angstrom layer of titanium nitride, for example, is formed by CVD, PVD, ALD, combinations of the above, or the like. After depositing the metal layer 500 over the semiconductor device the device is annealed so that the metal layer forms a blocking layer which is to be reflective at 850 microns or the wavelength of the light being emitted by the optical fiber. In the embodiment where the metal layer 500 is a metal stack of cobalt and titanium nitride, the resulting material after anneal is a silicide.

Figure 24:
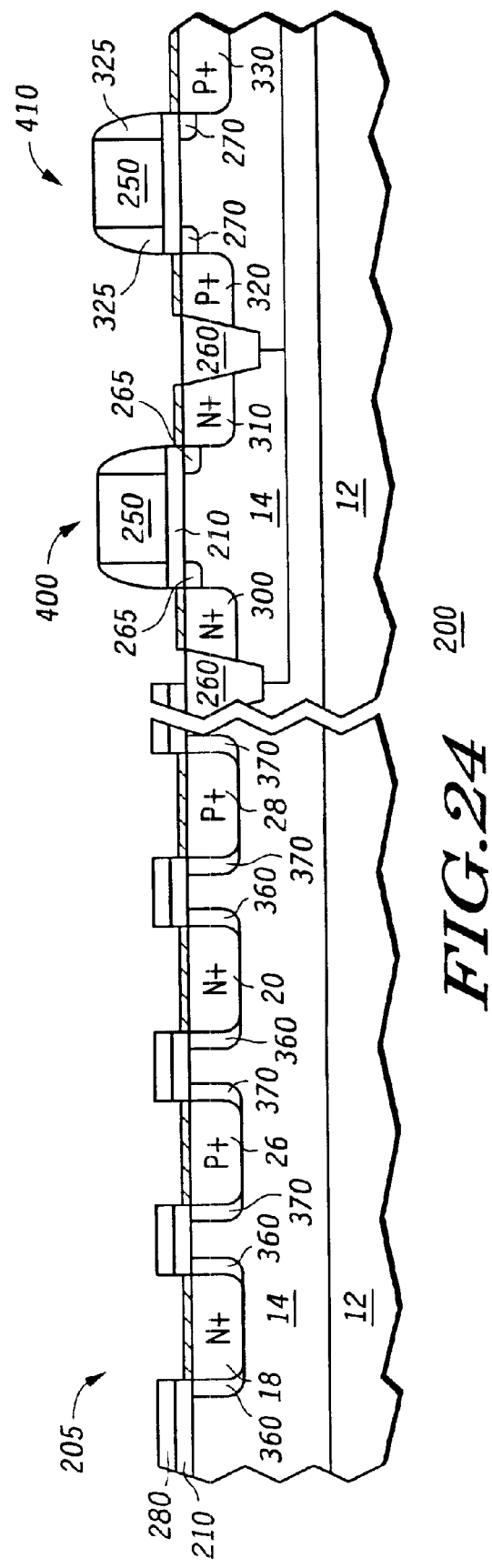

As shown in FIG. 24, the anneal results in a silicide formed over the doped regions 300 and 310 of the first transistor 400 and doped region 320 and 330 of the second transistor 410 as well as silicide over the doped regions 18, 26, 20 and 28 of the photodetector 205 Silicide is not formed over the nitride layer 280 due to the chemistry of the nitride layer 280. The silicide 510 is used as a light-barrier or blocking layer in order to prevent the transmission of light to the electrodes (the N+ regions 18 and 20 and P+ regions 26 and 28) so that electrons and holes are not generated in these regions. The generation of electrons and holes in the N+ and P+ regions of the photodetector will negligibly impact the speed of the photodetector because there is a low electric field within these electrode regions. Thus, the electrodes and holes formed within these electrode regions will collect at the electrodes via a diffusion process rather than drift, thereby reducing the speed of the device.

Any reflective material or reflective metal can be used as the light-barrier layer. The light-barrier layer need only block or reflect light at a desired wavelength (the wavelength of the light being emitted by the optical fiber). Thus, the reflective material need not be reflective to light with a wavelength in the visible spectrum, provided the material is reflective at the wavelength required for operation of the optical device.

Although both a silicide process and an implementation process to form pockets 360 and 370 was described in regards to FIGS. 14–22, it is not necessary to use the silicide process when forming the pockets nor is it necessary to form the pockets when using the silicide. However, using both allows for further improvements in the (quantum) efficiency of the photodetector. It is also is not necessary to incorporate the silicide process used to form photodetector with the formation of transistors on the same wafer. Instead, the silicide process can be used alone.

As a skilled artisan should appreciate by now, the silicide process has the advantage of being easily incorporated into a traditional CMOS process flow without adding additional photolithographic steps that, generally, require the use of expensive masks and forming the N-type and P-type pockets allows for the ability to increase the efficiency of the photodetector.

Although the pockets and electrodes for the photodetector were formed by ion implanting the semiconductor layer, other processes can be used. For example, trenches can be etched in the semiconductor layer and a first in situ layer doped with a first dopant species can be formed within the trench and serve as the pockets. Afterwards, a second in situ layer doped with a second dopant species that is different than the first dopant species is formed within the trench. Alternately, the formation of electrodes for the photodetector does not have to be comb-like as shown in FIG. 3, and instead can be interleaved in a circular formation or any other suitable formation.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An optical device formed in a semiconductor layer, the optical device comprising:
   a first doped region having an first conductivity type;
   a second doped region having a second conductivity type;
   a first light absorbing region interposed between the first and second doped regions;
   a third doped region having the first conductivity type;
   a second light absorbing region interposed between the second and third doped regions;
   a fourth doped region having the first conductivity type interposed between the first light absorbing region and the second doped region; and
   a fifth doped region having the first conductivity type interposed between the second light absorbing region and the second doped region.

2. The device of claim 1 wherein the device is a lateral device.

3. The device of claim 1 wherein the fourth doped region is adjacent to the second doped region.

4. The device of claim 1 wherein the fourth doped region is more lightly doped than the first doped region.

5. The device of claim 1 further comprising:
   a sixth doped region having the second conductivity type interposed between the first doped region and the light absorbing region.

6. The device of claim 5 wherein the sixth doped region is adjacent to the first doped region and the fourth doped region is adjacent to the second doped region.

7. The device of claim 5 wherein the sixth doped region is more lightly doped than the second doped region.

8. The device of claim 5 wherein the fourth doped region and the sixth doped region are doped with approximately a same concentration.

9. The device of claim 1 wherein the semiconductor substrate comprises silicon.

10. The device of claim 1 further comprising processing circuitry formed in the semiconductor substrate.

11. The device of claim 10 wherein the processing circuitry comprises gates and interconnects and source and drain regions.

12. The device of claim 1 further comprising a light-barrier layer overlying the first, second, and third doped layers.

13. The device of claim 12 wherein the light-barrier layer comprises a reflective metal.

14. The device of claim 12 wherein the reflective metal comprises silicide.

15. The device of claim 1 wherein the first conductivity type is P-type and the second conductivity type is N-type.

16. The device of claim 1 wherein the first and third doped regions are substantially parallel to each other and are electrically connected.

17. The device of claim 16 wherein the first, second, and third doped regions are interleaved.

18. The device of claim 1 further comprising a grating formed over at least a portion of the first light absorbing region.

19. The device of claim 1 further comprising an insulating layer beneath the first light absorbing region, wherein the grating, the first light absorbing region, and the insulating layer form a waveguide portion.

20. An optical device formed in a semiconductor layer, the optical device comprising:
 a first doped region having an first conductivity type;
 a second doped region having a second conductivity type;
 a first light absorbing region interposed between the first and second doped regions; and
 a light-barrier layer overlying at least one of the first and second doped regions.

21. The device of claim 20 wherein the light-barrier layer comprises a reflective metal.

22. The device of claim 21 wherein the reflective metal comprises silicide.

23. The device of claim 20 further comprising a grating formed over at least a portion of the first light absorbing region.

24. The device of claim 20 further comprising an insulating layer beneath the first light absorbing region, wherein the grating, the first light absorbing region, and the insulating layer form a waveguide portion.

25. The device of claim 20 further comprising a third doped region having the first conductivity type interposed between the light absorbing region and the second doped region.

* * * * *